United States Patent [19]
Daebler

[11] 3,935,773
[45] Feb. 3, 1976

[54] APPARATUS FOR CONDITIONING COMPONENT LEADS

[75] Inventor: Donald H. Daebler, Albuquerque, N. Mex.

[73] Assignee: GTE Automatic Electric Laboratories Incorporated, Northlake, Ill.

[22] Filed: Mar. 17, 1975

[21] Appl. No.: 559,109

[52] U.S. Cl. .................. 83/331; 83/345; 83/401; 83/418; 83/438; 83/449; 83/566; 83/733; 83/925 R
[51] Int. Cl.² .................. B23D 25/12; B26D 7/06
[58] Field of Search .......... 83/331, 343, 345, 401, 83/409.1, 410, 411 R, 418, 438, 448, 449, 423, 566, 926 B, 925 R, 733

[56] References Cited
UNITED STATES PATENTS
3,367,223  2/1968  Caraisco et al. ............. 83/925 R X

*Primary Examiner*—J. M. Meister
*Assistant Examiner*—W. D. Bray
*Attorney, Agent, or Firm*—Russell A. Cannon; Leonard R. Cool

[57] ABSTRACT

Box capacitors are loaded onto an in-line track feeder with the capacitor leads extending downward between a pair of tracks. Vibration of the tracks moves the capacitors thereon so that the capacitor leads pass between the meshing teeth of a drive gear and an idler gear that is caused to turn by the former. The tracks are spaced from the gears to prevent damping of vibrations of the former. The leading edges of the teeth on the gears have a radius thereon for providing smooth feeding action of the capacitor leads between the gear teeth. The drive gear also has a chamfer on the top edges of the teeth thereof to reduce the possibility of jamming on components with bent leads. A disk is attached to the underside of the idler gear for cutting the component leads to a prescribed length as they pass between the disk and the drive gear. The ends of the teeth on the idler gear are truncated such that a cut lead is compressed into a valley between teeth on the drive gear to thereby straighten these leads.

22 Claims, 14 Drawing Figures

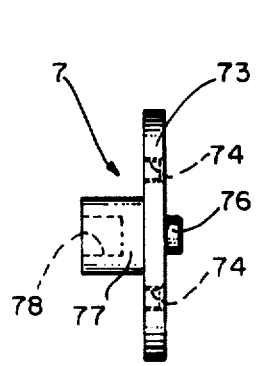
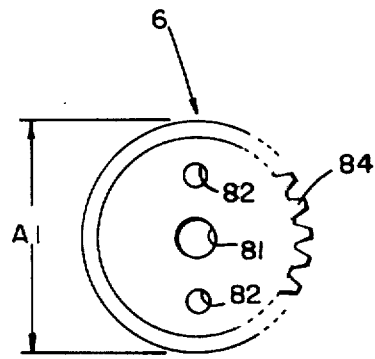
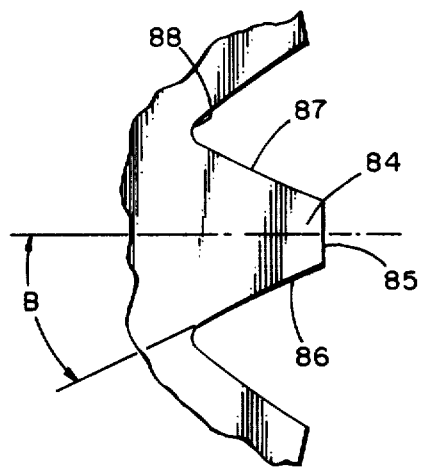
Fig. 9.  Fig.10.  Fig.11.
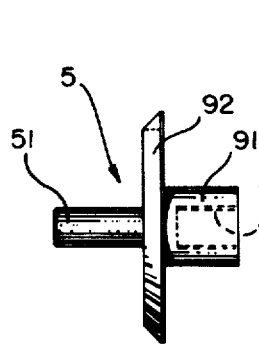
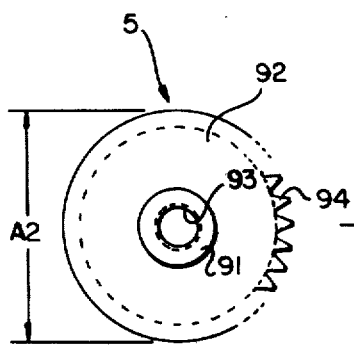
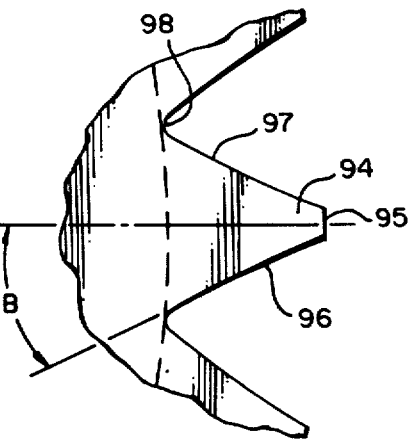
Fig.12.  Fig.13.  Fig.14.

APPARATUS FOR CONDITIONING COMPONENT LEADS

BACKGROUND OF THE INVENTION

This invention relates to apparatus for cutting component leads to a prescribed length for insertion into holes in a printed circuit board and more particularly to improved apparatus for conditioning component leads by cutting them to a prescribed length and/or straightening them.

In order to facilitate insertion of electrical components in printed circuit boards, it is desirable that the leads of such components be preconditioned by forming them to a prescribed pattern and cutting them to a prescribed length. Box capacitors essentially have a rectangular cross section and a pair of leads that are spaced apart along the diagonal of a flat base thereof and which are orthogonal to this base. The overall dimensions of such components are variable. It is desirable that box capacitor leads be cut to a prescribed length and be relatively straight before insertion into a printed circuit board. Prior-art equipment for cutting box capacitor leads to prescribed lengths includes apparatus in which the capacitors are loaded and unloaded by hand, a cutting shear being actuated by a foot control to cut the leads to the desired length. Semi-automatic prior-art machines employ intricate discharge mechanisms since such machines are not designed to operate on more than one component at a time. Semi-automatic apparatus for performing this cutting function also includes an in-line track feeder to move box capacitors into a shear-type cutting tool. This machine does not provide cut leads of uniform length nor does it provide any degree of lead straightening.

An object of this invention is the provision of improved apparatus for conditioning component leads.

DESCRIPTION OF DRAWINGS

FIG. 9 is a side view of the cutting disk 7 in FIG. 8.

FIG. 10 is a top view of the idler gear 6 in FIG. 7.

FIG. 11 is an enlarged top view of a portion of the idler gear 6 in FIG. 10 for illustrating the shape of the teeth thereon.

FIG. 12 is a side view of the drive gear 5 in FIG. 7.

FIG. 13 is a bottom view of the drive gear 5 in FIG. 7 and taken looking to the left in FIG. 12.

FIG. 14 is an enlarged view of a portion of the drive gear 5 in FIG. 13 for illustrating the shape of the teeth thereon.

FIGS. 1 – 4 are generally drawn to a scale of 50% in relation to a machine embodying this invention that was built and successfully operated. FIGS. 5 – 14 are generally drawn to a scale of 100% in relation to that machine.

DESCRIPTION OF PREFERRED EMBODIMENTS

This invention is useful in cutting the leads of a box capacitor or similar article to a prescribed length and/or straightening them so that they are readily insertable into holes in a printed circuit board.

Figure 1:
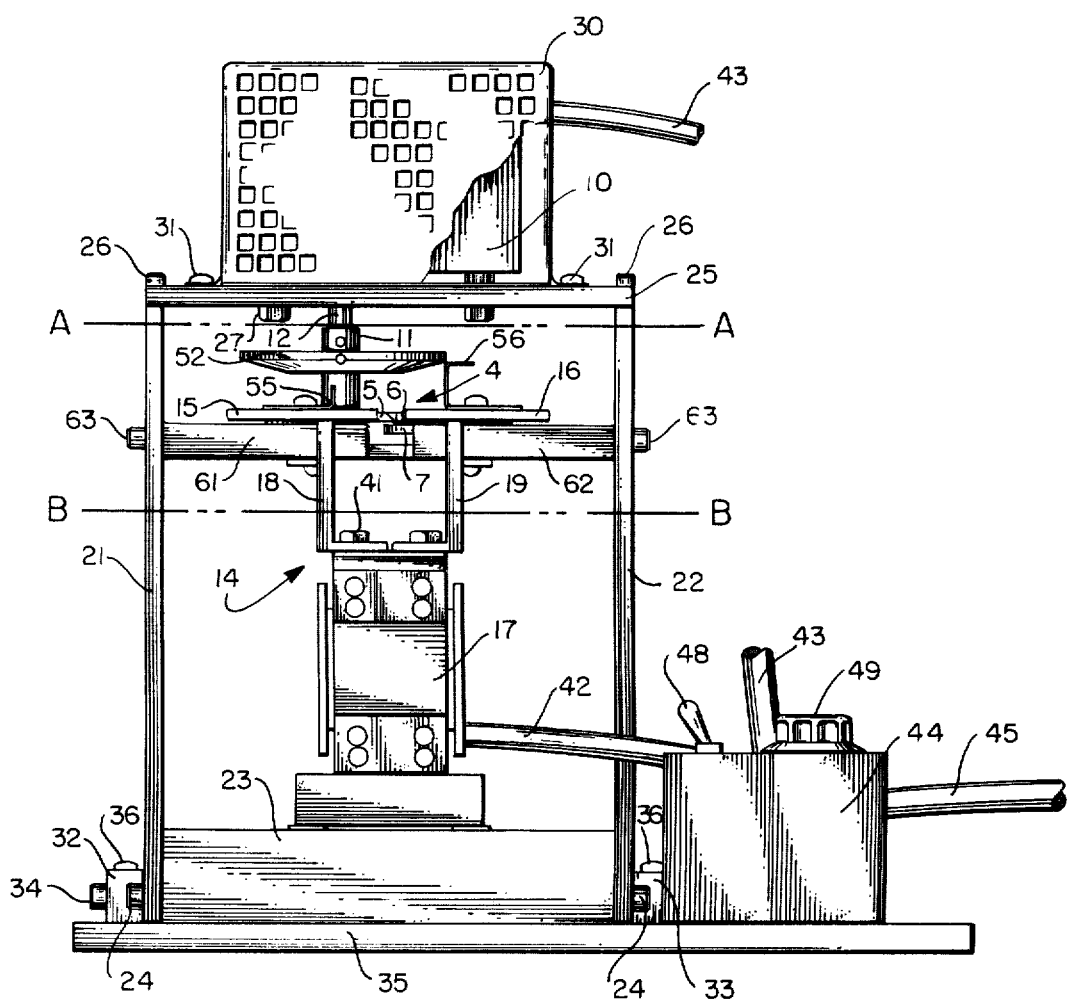
FIG. 1 is a front view of a machine embodying this invention.
Figure 2:
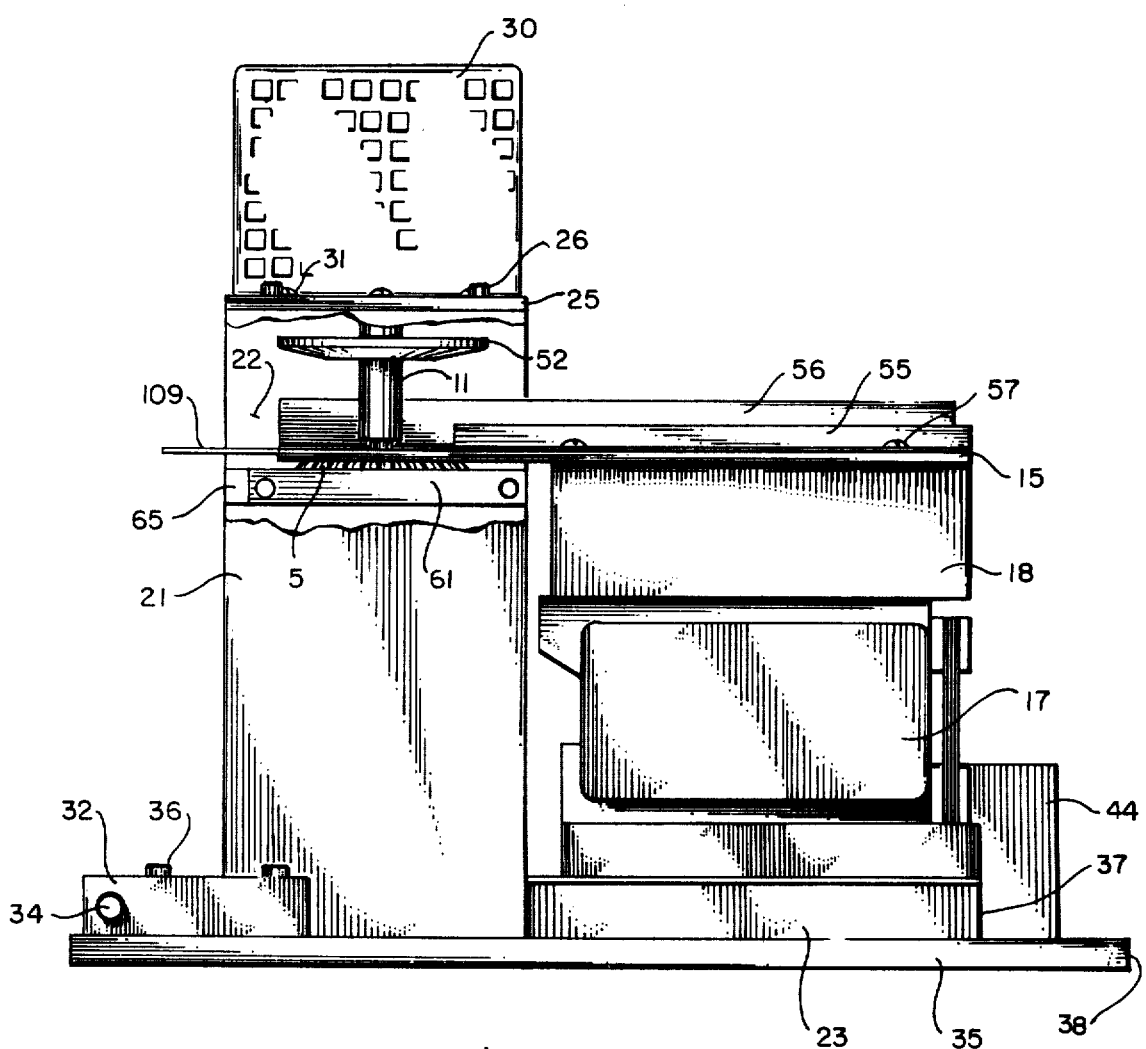
FIG. 2 is a left-side view of the machine in FIG. 1, with a portion of the side wall 21 broken away for purposes of illustration.

Referring now to FIGS. 1 and 2, a machine embodying this invention generally comprises: a support frame; a gearing mechanism 4 that is supported on the frame and which includes a drive gear 5, an idler gear 6, and a cutting disk 7, the latter being attached to the bottom of the idler gear 6 (see FIG. 8); a drive mechanism on the frame that includes a motor 10 and adapter shaft 11 that is connected to the drive shaft 12 of the motor and to the drive gear 5; and a vibratory feed mechansim 14 that includes a pair of feed tracks 15 and 16 that are mounted on a vibrator 17 through associated L-shaped flanges 18 and 19.

Figure 3:
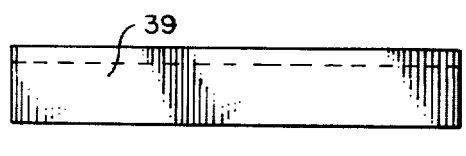
FIG. 3 is a front view of a wedge-shaped shim 39 for insertion between the ends 37 and 38 of base plates 23 and 35 for tilting the feed tracks 15 and 16 with respect to the lower base plate 35.
Figure 4:
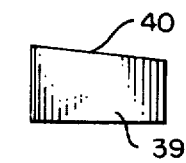
FIG. 4 is a side view of the shim in FIG. 3.

The support frame comprises a pair of side walls 21 and 22 that are rigidly attached to a movable base 23 by screws 24 and to a top plate 25 by screws 26. The motor 10 is secured to the top plate 25 by screws 27. A screen 30 that covers the motor 10 is secured to plate 25 by screws 31. A pair of mounting plates 32 and 33 are rotatably secured to the sides of base 23 by screws 34. The mounting plates 32 and 33 are also rigidly secured to a second base plate 35 by screws 36. Thus, the support frame may be pivoted with respect to the second base member 35 and about the axis of the screws 34 in plates 32 and 33. A wedge-shaped shim 39 (see FIGS. 3 and 4) is located between the fronts 37 and 38 of the bases 23 and 35 to maintain the feed tracks 15 and 16 at an angle with respect to a horizontal reference plane and the base 35. In operation, this construction aids in causing parts loaded onto the tracks 15 and 16 to automatically progress along the tracks toward the gears 5 and 6 as is described more fully hereinafter. The shim 39 is shown here separated from the frame in order to simplify the drawings. The overall height and taper on the top 40 of the shim may be varied depending on the size of the components being conditioned by the machine.

The vibrator 17 of the feed mechanism is mounted on plate 23 by screws (not shown). The vibrator is a commercially available device and may, by way of example, be a model T-8, manufactured by Automation Devices of Santa Fe Springs, Calif. The tracks 15 and 16 are secured to the tops of associated light-weight L-shaped flanges 18 and 19 by screws (not shown), these flanges also being secured to the top of the vibrator 17 by screws 41. Electrical power for operating the vibrator 17 and motor 10 is applied thereto on cords 42 and 43, respectively, from a controller 44 which is connected to a source of electrical power through cord 45. Actuation of the vibrator 17 and drive motor 10 is controlled by switch 48. The amount of drive current applied to the vibrator 17 is adjusted by varying the control knob 49. Alternatively, separate switches and control knobs may be associated with the vibrator 17 and drive motor 10 where the speed of the motor is related to the drive voltage.

Referring now particularly to the enlarged views in FIGS. 5 – 8 of the selected portions of the machine between the lines A—A and B—B in FIG. 1, the tracks 15 and 16 are spaced apart sufficiently to allow leads of a box capacitor to pass therebetween without the device falling through this opening. The edges 111 and 112 of the tracks are parallel to the tangent lines (not shown) to the circumference to the gears at the mesh point thereof. An adapter shaft 11 is employed to connect the drive gear 5 to the drive shaft 12 on the motor 10. The shaft 11 extends over the drive shaft 12 of the motor 10 and a cylindrical shank 51 on the drive gear 5 and is attached thereto by Allen screws. The motor 10 may be an 18 rpm shaded pole-gear motor, manufactured by Dayton Corporation of Newark, Ohio. A top guide 52 that has the bottom side thereof chamfered fits over the circumference of adapter shaft 11 and is secured thereto by an Allen screw. The height of the guide 52 along shaft 11 is adjustable for accommodating box capacitors of different heights. Since the top guide 52 and drive gear 5 are both attached to the same shaft, they rotate about the same axis and at the same rate.

A pair of side guides 55 and 56 are attached to associated tracks 15 and 16 by screws 57 and 58 to aid in maintaining the box capacitors in an upright position as they travel along the tracks. The guides 55 and 56 may be moved toward or away from the opening between the tracks 15 and 16 for accommodating box capacitors of different sizes. The shorter L-shaped side guide 55 preferably extends only a short distance under the top guide 52, whereas the taller U-shaped side guide 56 preferably extends past the cutting part of the gears. This orientation of the guides 55 and 56 in relation to the meshing gears 5 and 6 aids in maintaining the box capacitors in an upright position as the leads thereof are conditioned by being cut and straightened as they pass through the gears.

Figure 8:
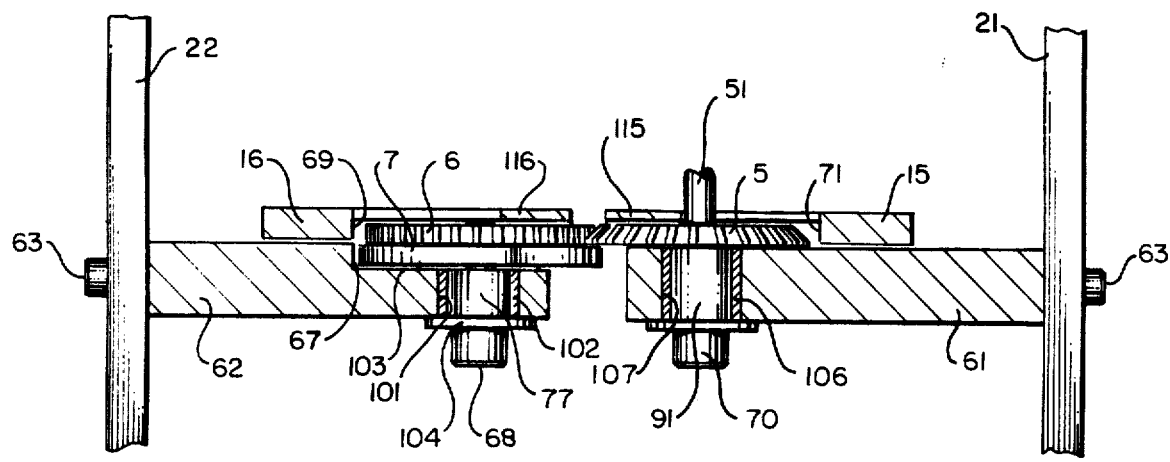
FIG. 8 is an end view taken along lines C—C in FIG. 7, with only plates 61 and 62 and tracks 15 and 16 shown in section for simplicity of illustration.
Figure 7:
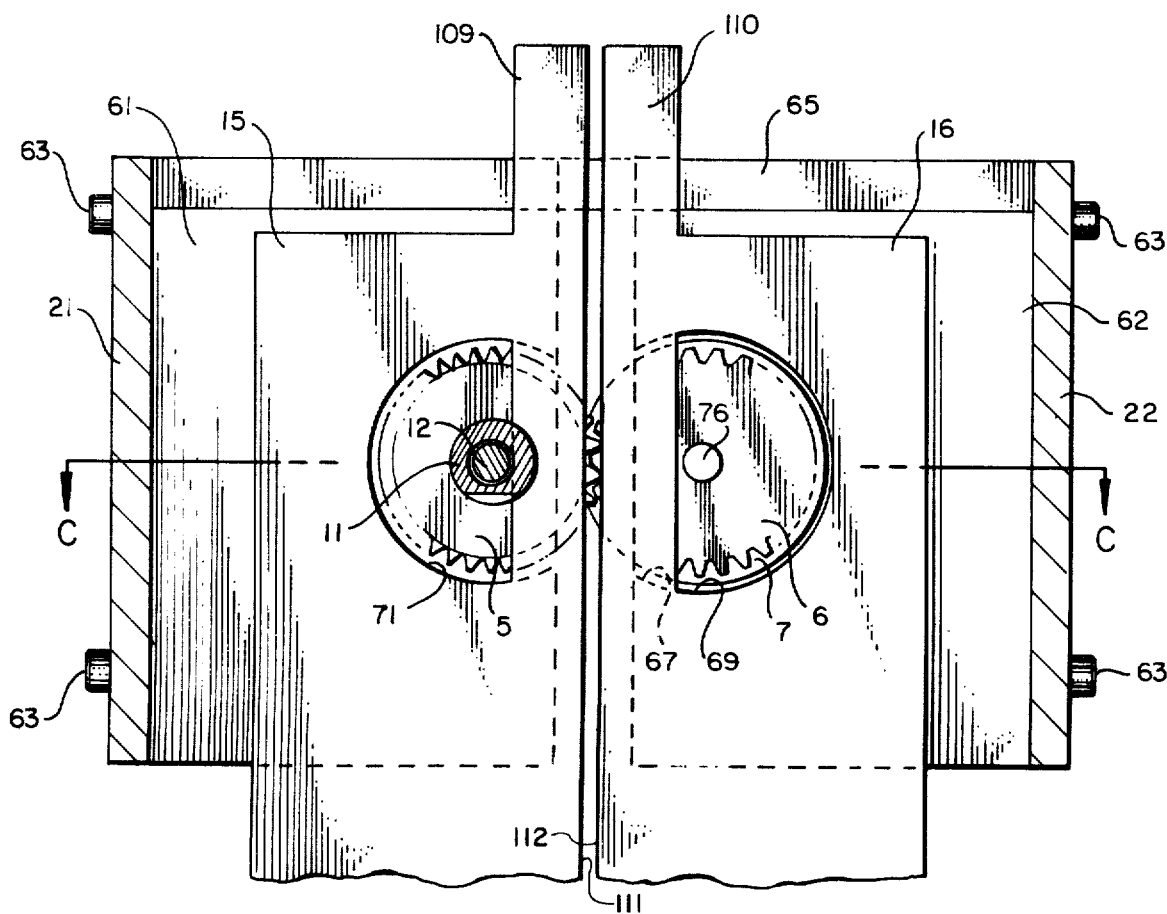
FIG. 7 is a top view of the portion of the machine that is shown in FIG. 5, with the top guide 52 and the side guides 55 and 56 removed for purposes of illustration.

As is shown more clearly in FIGS. 7 and 8, the gearing mechanism 4 is mounted on a pair of support plates 61 and 62 that are attached to associated side plates 21 and 22 of the frame by screws 63. A bar 65 is attached to the back of the plates 61 and 62 to provide additional support since these plates are spaced apart at the center of the frame. Briefly, the cutting disk 7 (which is shown in detail in FIG. 9) is located in an opening 67 in the top of the right plate 62. The idler gear 6 (which is shown in detail in FIGS. 10 and 11) is secured to the cutting disk 7 by screws (not shown). The cutter 7 is secured to the top of the right plate 62 by a screw 68, with the idler gear 6 located in a recessed opening 69 in the right track 16. Similarly, the drive gear 5 (which is shown in detail in FIGS. 12 – 14) is secured to the top of left plate 61 by a screw 70 and is located in a recessed opening 71 in the left track 15. The axes of the gears 5 and 6 are orthogonal to the common plane therethrough that is parallel to the top surfaces of plates 61 and 62. The tracks 15 and 16 are spaced sufficiently from the associated gears 5 and 6 and plates 61 and 62 that these elements do not touch during operation of the machine. This spacing is somewhat exaggerated in FIGS. 1 and 2 for purposes of illustration.

The cutter 7 comprises a disk-shaped body 73 having a pair of threaded openings 74 therein, and a pair of coaxial shanks 76 and 77 that project from opposite sides of the body 73 (see FIG. 9). The larger diameter shank 77 has a threaded opening 78 therein. The diameter of the disk body 73 is greater than that of the idler gear 6 in FIG. 10. The idler gear has a central aperture 81 and holes 82 therein. The idler gear 6 is secured to the cutter disk 7 by screws that extend through the holes 82 and are threaded into the openings 74 in the disk body 73.

Stub teeth 84 are formed on the circumference of the idler gear 6 (see FIGS. 10 and 11). Each tooth 84 has a flat 85 on the end thereof on the circumference of the idler gear. The leading edge 86 of each tooth 84 preferably has a radius thereon for aiding in providing a smooth feeding action of capacitor leads into the gear mechanism 4. The trailing edges 87 of the teeth 84 may be flat. Since box capacitors have a rectangular cross section with the leads located on the diagonal, the lead spacings on all such elements are related by the factor $\sqrt{2} = 1.414$. The chord spacing between radii through the centers of adjacent teeth 84 on a circle through the valleys 88 is therefore preferably related to this factor. In a machine that was built and successfully tested, the idler gear has 30 teeth; a chord spacing between the teeth 84 of 0.1414 inch; a diameter A1 of 1,519 inches; a leading edge 86 radius of 0.5 inch; a flat 85 that was 0.047 inch wide; a valley 88 radius of 0.016 inch; and a tooth angle B of typically 25°.

The drive gear 5 is similar to the cutter 7 in that it has a pair of coaxial shanks 51 and 91 that project from opposite sides of the body 92 thereof, the larger-diameter shank 91 having a threaded opening 93 therein (see FIGS. 12 – 14). The drive gear 5 is also similar to the idler gear 6 in that it preferably has similarly shaped stub teeth 94 having flats 95 on the ends thereof, has leading edges 96 with the same radius, has flat trailing edges 97 on the teeth 94, has a valley 98 of the same radius, has the same number of teeth thereon, has the same tooth angle B, and has the same chord spacing of the teeth. The principal difference between the gears 5 and 6 is that the ends of the top of the teeth 94 are chamfered at a 45° angle. This shaping of the teeth 94 aids in preventing jams when a box capacitor having severely bent leads is passed into the gearing mechanism 4. The radius on the leading edge 96 on teeth 94 provides smooth feeding of capacitor leads into valleys 98 by the cutter disk 7. The diameter A2 of the drive gear 5 in the machine that was built and operated was also slightly larger than that of the idler gear 6, although this is not believed to be essential. In that machine, the diameter A2 of the drive gear 5 was 1.558 inches, and the flats 95 on the teeth 94 thereof were typically 0.020 inch. Also, the cutter disk 7 in this machine had a diameter of 1.6 inches.

Figure 5:
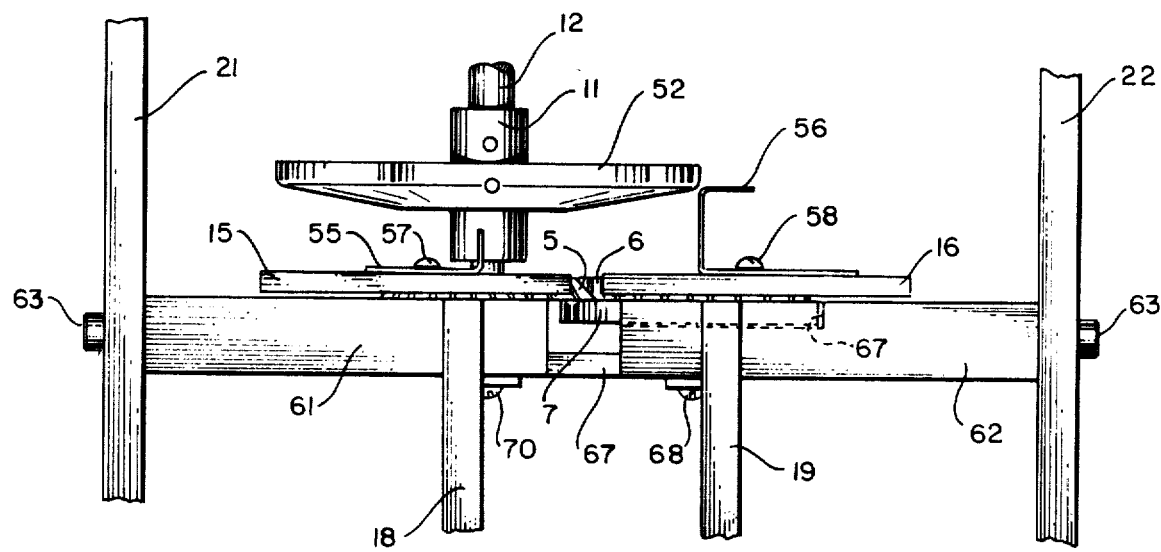
FIG. 5 is an enlarged front view of the portion of the machine between the broken lines A—A and B—B in FIG. 1.
Figure 6:
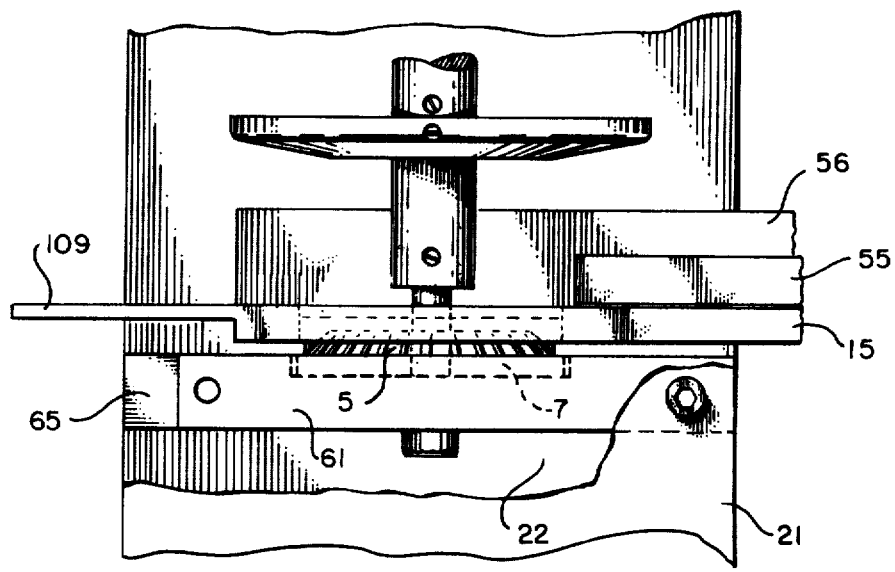
FIG. 6 is a left-side view of the portion of the machine in FIG. 5, with side plate 21 broken away for purposes of illustration.

Again referring particularly to the enlarged section view in FIG. 8, a pair of coaxial, circular openings 67 and 101 are formed in the plate 62 for receiving the cutter disk 7 and shank 77 thereof, respectively. A Boston bronze bushing 102 is located between the shank 77 and plate 62 in the opening 101 for providing a bearing surface so that these latter two elements do not bind or seize during rotation of the cutter disk 7 and shank 77. A phosphor bronze or beryllium copper washer 103 is employed between the bottom of disk 7 and the top of plate 62 for the same reason. The cutter 7 and idler gear 6 are rotatably secured in the plate 62 by a washer 104 and screw 68 that is threaded into the opening 78 in the shank 77. The drive gear 5 is mounted on plate 61 with the shank 91 and sleeve 106 in an opening 107 in a similar manner. The openings 101 and 107 in the plates 62 and 61 are spaced apart such that when the drive gear 5 meshes with the idler gear 6, a flat 85 on an idler gear tooth 84 is within 0.030 inch from a corresponding valley 98 on the drive gear. The circular openings 69 and 71 in the bottoms of tracks 16 and 15 receive the idler gear 6 and drive gear 5, respectively (see FIGS. 7 and 8). The flat top surfaces 115 and 116 of the tracks 15 and 16 extend over the gears 5 and 6, however, for providing smooth surfaces for enabling a box capacitor to move freely along the tracks (see FIG. 8). The nearly semicircular openings in the top of tracks 15 and 16 are employed in the drawings to more clearly illustrate the orientation of the gears 5 and 6 on plates 61 and 62 and in tracks 15 and 16. Such openings are not required in the top of the tracks. In the machine that was built and operated, a step was milled in the top and central edges 111 and 112 of the tracks and openings 69 and 71 drilled therethrough. A thin metal strip was then secured in the milled step by guide 55 to form a structure similar to that generally shown in FIGS. 7 and 8. Reference to FIGS. 5, 6, and 8 reveals that the tracks 15 and 16 are spaced from the plates 61 and 62 as well as the gears 5 and 6. This allows the tracks to vibrate freely so as to move a box capacitor thereon over the ends 109 and 110 thereof.

In operation, the shim 39 is preferably located between the fronts 37 and 38 of the bases 23 and 35 to tilt the feed tracks 15 and 16 with respect to the horizontal axis and base 35 (see FIG. 2). The vibrator 17 is energized to produce a vibratory motion of the feed tracks 15 and 16. The motor 10 is also energized to rotate the drive gear 5 which in turn rotates the idler gear 6 and the cutter disk 7. Box capacitors having leads to be cut and/or straightened are loaded onto the tracks 15 and 16 with the sides thereof proximate the side guides 55 and 56 and the top of the capacitor proximate disk 52, the capacitor leads extending into the opening between the tracks. It is not essential that the capacitor leads be in line when the capacitors are between the side guides 55 and 56.

The vibratory motion and tilt on the tracks 15 and 16 cause the capacitors to move along the former toward the gear mechanism 4. Shortly after a box capacitor passes beyond the end of the side track 15, a tooth 94 of drive gear 5 picks up the forward lead thereof and draws it toward the point where the gears mesh. The longer side guide 56 and top guide 52 operate to maintain the capacitor in an upright position as the cutter disk 7 forces the forward load deeper into the valley 98 between a pair of drive gear teeth 94. The cutter disk 7 passes under the drive gear 5 and cuts the capacitor lead to a prescribed length which is related to the spacing between the top of the tracks and the top of cutter disk 7. The length of the cut leads may be changed by increasing the thickness of gears 5 and 6 and by placing a shim (not shown) between the bottoms of the tracks 15 and 16 and the tops of associated flanges 18 and 19. The gears 5 and 6 are designed to mesh and are positioned on the plates 61 and 62 such that a flat on an idler gear tooth 84 comes within approximately 0.030 inch of a valley 98 on the drive gear. A tooth 84 of the idler gear therefore forces the cut lead firmly into the valley 98 between a pair of drive gear teeth 94 to straighten the lead after it is cut. The other capacitor lead is drawn into the gears, cut and straightened in a similar manner. Vibration of the tracks 15 and 16 causes box capacitors to continue forward movement thereof until they fall off the ends 109 and 110 of the tracks.

Although this invention is described in relation to conditioning a pair of leads on box capacitors, it is not limited to operation on such components. This invention may be employed with components having only one lead or having various patterns of more than two leads since the component is free to rotate under the top guide 52 after each lead is cut. Also, the components having leads to be conditioned can have a shape with other than a box-like rectangular cross section. It is desirable, however, that the leads to be conditioned be approximately perpendicular to a relatively flat surface thereof. Further, this invention can also be employed to merely straighten the leads of a component. The drive means may also be connected to either or both of the gears and/or the cutter disk which may be located on a separate shaft rather than the idler gear. In the machine that was built and operated, it was found that the side guide 55 was not absolutely essential since the guides 52 and 56 would maintain a box capacitor in a vertical position at the leads thereof were cut. This invention is therefore defined by the attached claims rather than by the detailed description of the preferred embodiments thereof.

What is claimed is:

1. Apparatus for conditioning leads of a component that has a body with at least one lead extending from a surface thereof, comprising:
   a first gear having an axis and having teeth on the circumference thereof,
   a second gear having an axis and having teeth on the circumference thereof,
   first supporting means supporting said gears relative to a common plane therethrough that is perpendicular to the axes of said gears with the teeth thereof meshing,
   the ends of the teeth on at least said first gear being truncated such that at the mesh point of said gears the end of a truncated tooth on said first gear is spaced a distance from the valley between teeth on said second gear by an amount that is substantially equal to the thickness of a component lead,
   drive means coupled to at least one of said gears for providing rotating motion of said gears,
   second supporting means for supporting components over a path that extends past the mesh point of said gears along a line that is generally parallel to the tangent to said gears with the component surface spaced from the common plane and component leads extending from this surface in the direction of the common plane, and
   means for moving the components along the path with a length of component lead adjacent the component surface passing through the mesh point of said gears for thereby conditioning the leads.

2. Apparatus according to claim 1 including a cutter disk that is coaxial with said first gear on the side thereof that is spaced from the component surface, that is rotated at the same rate as said first gear, and that has a diameter such that the circumference thereof extends past the valleys between teeth on said second gear at the mesh point of said gears for conditioning component leads by cutting them to a prescribed length.

3. Apparatus according to claim 2 wherein the teeth on said second gear have a chamfer on the edges thereof that are spaced away from said cutter disk.

4. Apparatus according to claim 3 including a radius on the leading edges of the teeth on said second gear.

5. Apparatus according to claim 3 including a radius on the leading edges of the teeth on both of said gears.

6. Apparatus according to claim 4 wherein said second supporting means comprises a pair of tracks that are spaced apart, that have flat surfaces in a second plane that is spaced from and is parallel to the common plane, said tracks extending past said gears with the space between said tracks being aligned with the mesh point of said gears, said tracks being spaced apart from said gears.

7. Apparatus according to claim 6 wherein said second supporting means comprises a side guide that is connected to the track that extends past said first gear for maintaining components in a position with the leads thereof extending through the space between said tracks and projecting in the direction of the common plane and said gears.

8. Apparatus according to claim 7 wherein said second supporting means includes a disk-shaped top guide that is coaxial with one of said gears on the side of said tracks that is spaced from said gears, and that is rotated at the same rate as said gears; said top guide having a diameter that is greater than that of said gears, extending over the mesh point of said gears, and being spaced from said tracks for supporting components as a lead thereof passes through the mesh point of said gears, said side guide extending beyond the mesh point of said gears.

9. Apparatus according to claim 8 wherein said moving means comprises a vibrator that is coupled to said tracks for vibrating the latter for moving components therealong.

10. In apparatus for conditioning leads of a component having a body with at least one lead extending from a component surface that is flat over at least a portion thereof, the apparatus including first means for supporting components over a path and second means for moving the components over the path and the component leads through a conditioning mechanism, an improved lead conditioning mechanism comprising:
 a first gear having an axis and having teeth on the circumference thereof,
 a second gear having an axis and having teeth on the circumference thereof,
 third means supporting said gears relative to a common plane therethrough that is perpendicular to the axes of said gears with the teeth thereof meshing,
 the ends of the teeth on at least said first gear being truncated such that at the mesh point of said gears the end of a truncated tooth on said first gear is spaced a distance from the valley between teeth on said second gears by an amount that is substantially equal to the thickness of a component lead,
 fourth means coupled to at least one of said gears for providing rotating motion of said gears,
 the second means causing components to pass the mesh point of said gears with the component leads extending in a direction such that they pass through the mesh point of the gears and are conditioned thereby.

11. The improvement according to claim 10 including:
 a cutter disk that is coaxial with said first gear and is located on the side thereof that is spaced from the component surface, said cutter disk having a diameter such that the circumference thereof extends past the valleys between teeth on said second gear at the mesh point of said gears; and fifth means for causing said cutter disk to rotate at the same rate as said gears for conditioning component leads by cutting them to a prescribed length.

12. The improvement according to claim 11 wherein the teeth on said second gear has a chamfer on the edges thereof that are spaced away from said cutter disk.

13. The improvement according to claim 12 including a radius on the leading edge of teeth on said second gear.

14. The improvement according to claim 12 including a radius on the leading edges of teeth on both of said gears.

15. In combination with the improvement according to claim 13, improved first-named means which is a support means comprising
 a pair of tracks that are spaced apart to have an opening therebetween that is aligned with the mesh point of said gears, that have flat surfaces thereof in a second plane that is spaced from and is parallel to the common plane, said tracks extending past and being spaced apart from said gears, and
 a slide guide bar that is attached to one of said tracks, said side guide bar extending beyond the mesh point of said gears for guiding a component for passing the leads thereof through the mesh point of said gears.

16. The improvement according to claim 15 wherein the improved first means includes a disk-shaped top guide that is coaxial with one of said gears on the side of said tracks that is spaced from said gears and is rotated at the same rate as said gears, the diameter of said top guide being greater than that of said gears and extending over the mesh point of said gears, said top guide being spaced from said tracks and cooperating with said side guide bar for supporting components as the leads thereof pass through the mesh point of said gears and thereby are conditioned.

17. The improvement according to claim 10 wherein the second means moves the component surface above the top of said gears with the leads extending downward, and including a cutter disk that is below said gears, that is coaxial with said first gear, that is rotated at the same rate as said gears, and that has a diameter such that the circumference thereof extends past the valleys between teeth on said second gear at the mesh point of said gears for conditioning component leads by cutting them to a prescribed length.

18. The improvement according to claim 17 wherein the teeth on said second gear have a chamfer on the edges thereof that are spaced away from said cutter disk.

19. The improvement according to claim 10 wherein the second means moves the component surface above the top of said gears with the leads pointing downward, and including a cutter disk that is coaxial with said first gear, that is below said gears, that is secured to the bottom side of said first gear that is spaced from the component surface for rotation at the same rate as said gears, and that has a diameter such that the circumference thereof extends past the valleys between teeth on said second gear at the mesh point of said gears for conditioning component leads by cutting them to a prescribed length, the teeth on said second gear having a chamfer on the top edges thereof that are spaced away from said cutter disk.

20. The improvement according to claim 19 including a radius on the leading edges of the teeth on said second gear.

21. In combination with the improvement according to claim 20, improved first means for supporting components comprising a pair of tracks that are spaced apart to have an opening therebetween that extends over the mesh point of said gears, that have top flat surfaces thereof in a second plane that is above and is parallel to the common plane, that extends over and past said gears, and that are spaced apart from said gears, and a slide guide bar that is attached to the one of said tracks that extends over said first gear, said slide guide bar extending beyond the mesh point of said gears for guiding a component for passing leads thereof through the mesh point of said gears.

22. The improvement according to claim 21 wherein the improved first means includes a disk-shaped top guide that is above and coaxial with one of said gears and is rotated at the same rate as said gears, the diameter of said top guide being greater than that of said gears and extending over the mesh point of said gears, said top guide being spaced above said tracks and cooperating with said side guide for supporting components as leads thereof are cut and are passed through the mesh point of said gears.

* * * * *

UNITED STATES PATENT AND TRADEMARK OFFICE
CERTIFICATE OF CORRECTION

PATENT NO. : 3,935,773
DATED : February 3, 1976
INVENTOR(S) : Donald H. Daebler

It is certified that error appears in the above-identified patent and that said Letters Patent are hereby corrected as shown below:

Column 2, lines 14 and 15, "and-/or" should read -- and/or --.

Column 4, line 25, "1,519 inches" should read -- 1.519 inches --.

Column 6, line 24, after "position", the word "at" should read -- as --.

Claim 12, column 8, line 9, "has" should read -- have --.

Claim 15, column 8, line 27, "slide guide bar" should read -- side guide bar --.

Claim 21, column 10, line 1, "slide guide bar" should read -- side guide bar --;

same claim 21, column 10, lines 2 and 3, "slide guide bar" should read -- side guide bar --.

Signed and Sealed this fifteenth Day of June 1976

[SEAL]

Attest:

RUTH C. MASON
*Attesting Officer*

C. MARSHALL DANN
*Commissioner of Patents and Trademarks*